United States Patent [19]

Farwell

[11] Patent Number: 5,181,191

[45] Date of Patent: Jan. 19, 1993

[54] BUILT-IN TEST CIRCUITRY PROVIDING SIMPLE AND ACCURATE AC TEST OF DIGITAL MICROCIRCUITS WITH LOW BANDWIDTH TEST EQUIPMENT AND PROBE STATIONS

[75] Inventor: William D. Farwell, Thousand Oaks, Calif.

[73] Assignee: Hughes Aircraft Company, Los Angeles, Calif.

[21] Appl. No.: 799,582

[22] Filed: Nov. 27, 1991

[51] Int. Cl.$^5$ .......................... G04F 8/00; G01R 15/12
[52] U.S. Cl. .................... 368/113; 368/118; 368/120; 324/73.1
[58] Field of Search ................. 368/113–120; 324/73 R, 73 AT, 73 PC, 78 R; 377/19, 20

[56] References Cited

U.S. PATENT DOCUMENTS

| | | | |
|---|---|---|---|
| 4,736,351 | 4/1988 | Oliver | 368/118 |
| 4,841,500 | 6/1989 | Lee | 368/120 |
| 4,878,209 | 10/1989 | Bassett et al. | 368/113 |
| 4,890,270 | 12/1989 | Griffith | 368/113 |
| 5,083,299 | 1/1992 | Schwanke et al. | 368/113 |

*Primary Examiner*—Vit W. Miska
*Attorney, Agent, or Firm*—L. A. Alkov; W. K. Denson-Low

[57] ABSTRACT

Circuitry and techniques are for transferring data between the automatic test equipment (ATE) and an integrated circuit under test pursuant to a slow clock that can have an arbitrarily long period, and for operating storage elements in the integrated circuit pursuant to a fast clock having a short period that corresponds to the clock rate at which combinatorial networks in the integrated circuit are to be tested. In one embodiment, input latches at inputs of the integrated circuit receive test data from the ATE, and output latches at the outputs provide test result data for the ATE. Pursuant the alternating single cycles of the slow clock and the fast clock, the delays through combinatorial networks between of a data propagation path between an input latch and an output latch are tested pursuant to the fast clock. In another embodiment, test data is serially scanned into scan registers pursuant to a series of slow clock cycles. After the test data has been scanned in, the scan registers are operated parallel to test the delays of combinatorial networks between the scan registers.

8 Claims, 4 Drawing Sheets

1

BUILT-IN TEST CIRCUITRY PROVIDING SIMPLE AND ACCURATE AC TEST OF DIGITAL MICROCIRCUITS WITH LOW BANDWIDTH TEST EQUIPMENT AND PROBE STATIONS

BACKGROUND OF THE INVENTION

The subject invention is directed generally to built-in test circuitry for allowing AC or delay testing of digital integrated circuits, and more particularly to built-in test circuitry for allowing AC testing without the need for high bandwidth test equipment.

Digital integrated circuits are typically designed to operate at predetermined clock rates, and AC or delay testing is performed to ascertain whether a digital integrated circuit is capable of operating at its design clock rate. As is well known, the maximum allowable clock rate of a digital integrated circuit is determined by the propagation delays of the combinatorial logic networks between latches or registers. Since internal nodes in integrated circuits cannot be directly accessed, the delays of individual gates cannot be directly measured for speed testing.

Testing of an integrated circuit is typically performed by use of automatic test equipment (ATE) which applies data and clock signals (commonly called test vectors) to the inputs of the integrated circuit, samples the resulting integrated circuit outputs, and compares the outputs with expected values. For AC or speed testing, the input data rate and clock frequency must be at the maximum for which the integrated circuit was designed, and the outputs must be sampled at such maximum rate.

A consideration with direct AC measurements by ATE is the requirement for high accuracy measuring capability. Testers meeting such requirement for high pin count and high clock rates are very expensive. Moreover, the fixturing (i.e., the interconnection components between the ATE and the integrated circuit being tested) required for ATE AC testing at high clock rates is expensive due to the higher bandwidth requirements, and also severely limits accuracy, particularly for wafer probe wherein microscopically aligned probes are placed in contact with the input and output (I/O) pads of the integrated circuits on a wafer. The connections to the wafer probes tend to limit bandwidth, and thus the data rate and clock frequency that can be used for testing.

SUMMARY OF THE INVENTION

It would therefore be an advantage to provide test circuitry that enables AC testing of digital integrated circuits with low bandwidth test equipment.

Another advantage would be to provide test circuitry that enables AC testing of digital integrated circuits with low bandwidth test equipment at the wafer level.

In accordance with the invention, circuitry and techniques are disclosed for transferring data between the automatic test equipment and the integrated circuit under test pursuant to a slow clock that can have an arbitrarily long period, and for operating storage elements in the integrated circuit pursuant to a fast clock having a short period that corresponds to the clock rate at which combinatorial networks in the integrated circuit are to be tested. In this manner, only the clock connection between the automatic test equipment needs to be of high accuracy and high frequency, while the remaining connections can be of low accuracy and low bandwidth.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
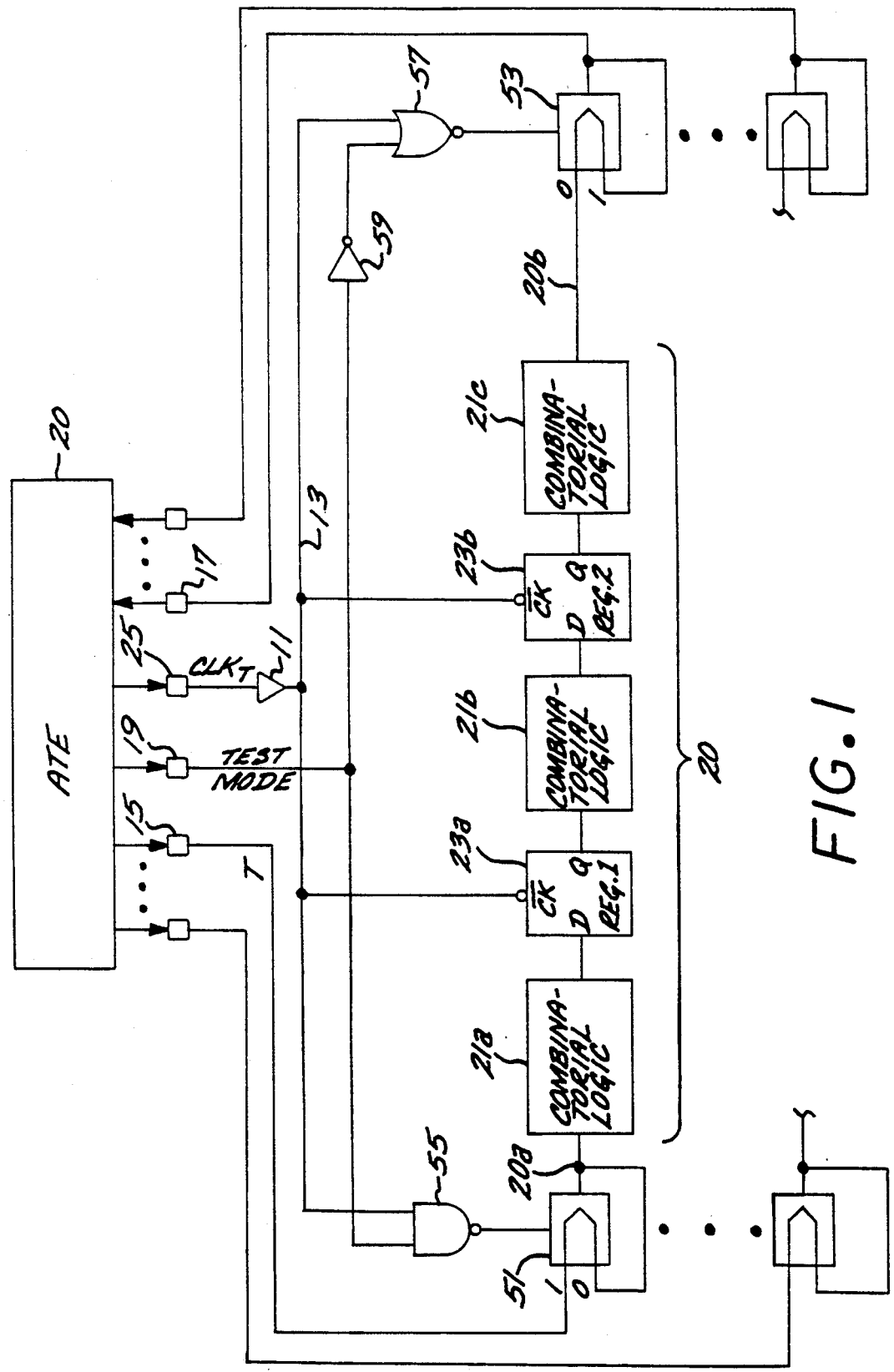
FIG. 1 is a schematic diagram of an AC test circuit in accordance with the invention.

In the following detailed description and in the several figures of the drawing, like elements are identified with like reference numerals.

The subject invention is directed to delay or speed testing of delay paths in integrated circuits. Each of such delay paths comprises a combinatorial logic network whose input may be provided by a register and whose output may be provided to a register. An integrated circuit contains a multitude of such delay paths, and for ease of illustration and explanation only a representative one of such delay paths is illustrated in the figures for the disclosed embodiments. Pursuant to the invention, automatic test equipment (ATE) provides a clock signal that is controlled to have a relatively low frequency and a high frequency that corresponds to the clock rate for which the integrated circuit is being speed tested. The low frequency clock is also referred to herein as the "slow" clock or the "long" clock (in reference to its period), while the high frequency clock is also referred to as the "fast" clock or the "short" clock (in reference to its period). In accordance with conventional techniques, electrical connections between the ATE and the integrated circuit are made at the input and output (I/O) pads of the integrated circuit for testing at the wafer level, or at the I/O pins for testing of a packaged integrated circuit. In the following description, connections to the integrated circuit will be generally described as being connections to the I/O pads, since ATE connections at the wafer level are made to the I/O pads via wafer probes, and since at the packaged level since the I/O pads electrically connected to the I/O pins which ATE connections are made.

Referring now to FIG. 1, set forth therein is an implementation of the invention as to a representative data propagation path 20 of an integrated circuit that includes a clock buffer 11 and a clock distribution system 13 as is commonly provided in digital integrated circuits. The data propagation path 20 extends between an input node 20a and an output node 20b. The input node 20a is connected to an I/O pad 15 via an input latch 51, and the output node is connected to an I/O pad 17 via an output latch 53. For testing in accordance with the invention, test data is provided by the ATE to the I/O pad 15, and result data is read by the ATE at the I/O pad 17.

The data propagation path 20 can be a single combinatorial logic network without registers or a plurality combinatorial logic networks with intervening registers which are clocked via the integrated circuit clock distribution system 13. Typically, for a propagation path that includes a N combinatorial logic networks, where N is an integer greater than N−1 registers would separate the combinatorial logic networks. FIG. 1 depicts the data propagation path as including three combinatorial logic networks 21a, 21b, 21c and intervening registers 23a, 23b. The combinatorial logic network 21a, which for example would include an input buffer, provides an input delay to the first register 23a. The combinatorial logic network 21b provides an internal logic delay to the second register 23b. The combinatorial logic network 21c, which would include an output buffer, provides an output delay to the output node 20b.

It should be appreciated that there is no limitation on the number of combinatorial logic networks and associated registers that can be included in the data propagation path 20.

The test circuit in accordance with the invention includes the input latch 51 whose input is connected to the I/O pad 15, and whose output is connected to the input node of the data propagation path 20. The operation of the input latch 51 is controlled by a control signal S such that the latch is latched when S is low, and is transparent when S is high. The control signal S is provided by a NAND gate 55 whose inputs are provided by the clock buffer 11 and a TEST MODE signal provided by ATE 20 to an I/O pad 19 of the integrated circuit. For test purposes, the input to the clock buffer 11 is a test clock signal $CLK_T$ that is provided by the ATE 20 to an I/O pad 25 of the integrated circuit. When the TEST MODE signal is high, the output of the NAND gate 55 is an inverted version of the test clock signal $CLK_T$; otherwise, the output of the NAND gate 55 is high. Thus, for normal operation of the integrated circuit, the TEST MODE signal is held low so that the input latch 51 is transparent and the input node 20a is connected to the I/O pad 15.

The test circuit further includes the output latch 53 having its input connected to the output node 20b and its output connected to the I/O pad 17. The operation of the output latch 53 is controlled by a control signal S' such that the latch is latched when S' is high, and is transparent when S' is low. The control signal S' is provided by a NOR gate 57 whose inputs are provided by the clock buffer and an inverter 59 whose output is an inverted version of the TEST MODE signal that is provided by the ATE 20. Thus, when the TEST MODE signal is high (test active), the control signal S' is an inverted version of the test clock signal $CLK_T$. When the TEST MODE signal is low for normal operation, the control signal S' is continuously low and the output latch 53 is continuously transparent so that the output node 20b is continuously connected to the I/O pad 17.

Figure 2:
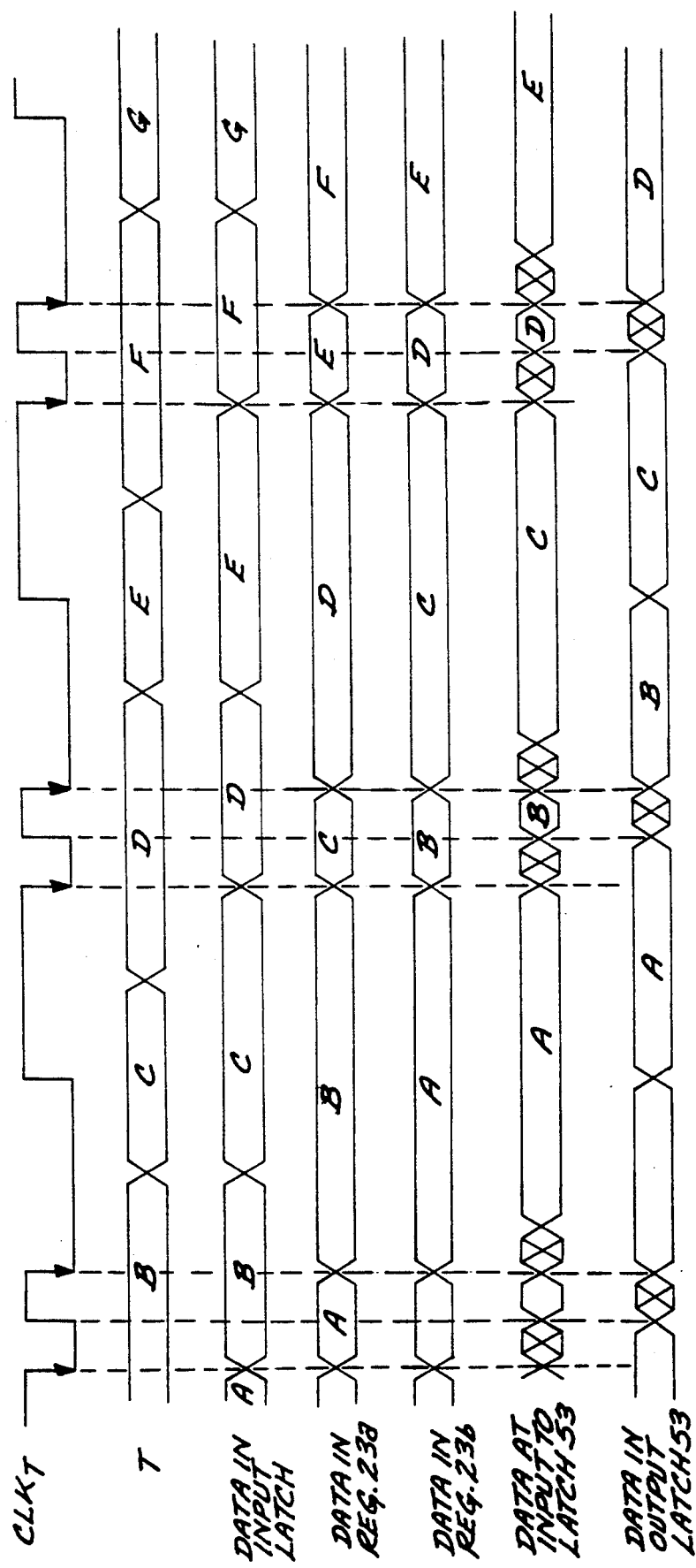
FIG. 2 is a timing diagram illustrating the timing and data propagation of the AC test circuit of FIG. 1.

Referring now to FIG. 2, set forth therein is a timing diagram illustrating the clocking, test vector input, and test result output of the test circuit of FIG. 1. The test clock $CLK_T$ provided by the ATE 20 comprises alternating single long (slow) and short (fast) clock cycles wherein each long clock cycle has a period that accommodates the ATE 20 or fixturing data transfer rate, and each short clock cycle has a predetermined period that corresponds to the clock rate at which the data propagation path is to be tested. The short clock period can be preset for a go-no go test, or it can be varied for a plurality of iterations of a test to determine the actual fastest internal clock period at which the integrated circuit will operate. The test vector T provided to the input latch 51 by the ATE 20 is configured to change state twice during each long clock cycle, generally in the center of each half-cycle of a long clock cycle. Effectively, the test vector T is provided at a rate that is about twice the rate of the slow clock which can have an arbitrarily long period as required for the particular implementation. Thus, the clocking of the test vector T can be as slow as required.

Pursuant to the timing of the test vector T, the output of the input latch 51 changes state during the first half-cycle of the long clock cycle (since the input latch 51 is then transparent), and at the negative transition at the start of the short clock interval (when the input latch 51 transitions from the latched state to the transparent state). The internal registers are clocked on the negative transitions of the clock signals thereto, and therefore are subject to alternating long and short clock periods, wherein a long clock period refers to the period between active clock transitions as defined by the slow clock frequency and a short clock period refers to the period between active transitions of the clock as defined by the fast clock frequency.

By application of the test vector T to the input latch 51, the short clock cycle provides for speed tests of the logic networks in the data propagation path 20 for specific transitions of the test vector T, as shown in FIG. 2, since the new data values provided at the inputs of the combinatorial logic networks pursuant to the active clock transition at the start of a short clock cycle must propagate sufficiently quickly so that the outputs of the combinatorial logic networks are stable pursuant to the new data values before the active clock transition at the end of the short clock period. Thus, a combinatorial logic network must have a propagation delays which is less than or equal to the period of the short clock; otherwise, the test results will be erroneous when ultimately read by the ATE 20. For a test vector T having bits A, B, C, and so forth, with the bit A being provided by the ATE 20 starting at the center of the second half-cycle of a long clock cycle, the input combinatorial logic network 21a is tested for the transitions A to B, C to D, and so forth. The internal combinatorial logic network 21b is speed tested for the transitions B to C, D to E, and so forth. Any subsequent internal combinatorial logic networks would be tested alternately for the A to B, etc. transitions and the B to C etc. transitions. The output combinatorial logic network 21c is speed tested for A to B etc. transitions or B to C transitions, depending on whether there are an odd or even number of internal combinatorial logic networks. For the specific example of one internal logic network 21b (i.e., odd), the output logic network is tested for the A to B etc. transitions.

Since each of the delay paths in the propagation path 20 are tested only for alternating transitions, complete testing is achieved by providing the test vector T twice with the contents thereof shifted by one period with respect to the clock for the test vector. Thus, for the above example, the second application of the test vector t would be phased such that the bit A starts at the center of the first half-cycle of a long clock cycle. The output data received by the ATE 20 is compared with expected results to determine pass or fail.

Pursuant to the control of the output latch 53, the bits of the test result output of the data propagation path are available at the output of the output latch 53 for about one-half cycle of the slow clock, and can be sampled at a clock rate that is about twice the rate of the slow clock.

The features of the foregoing implementation of the invention can be summarized a follows. The clock signal which acts on the I/O latches and the registers includes alternating slow and fast clock cycles, and data transfers to and from the ATE 20 take place only during the slow clock cycles which can be set arbitrarily low to accommodate the bandwidth requirements of the ATE 20 and/or test fixturing. The fast clock is set to correspond to the device speed specification or for a desired test speed. For complete testing, a test pattern is run two times wherein each run is out of phase by one clock period relative to the other. In this manner, every vector transition is tested at the fast clock rate, at every delay path within the integrated circuit.

Figure 3:
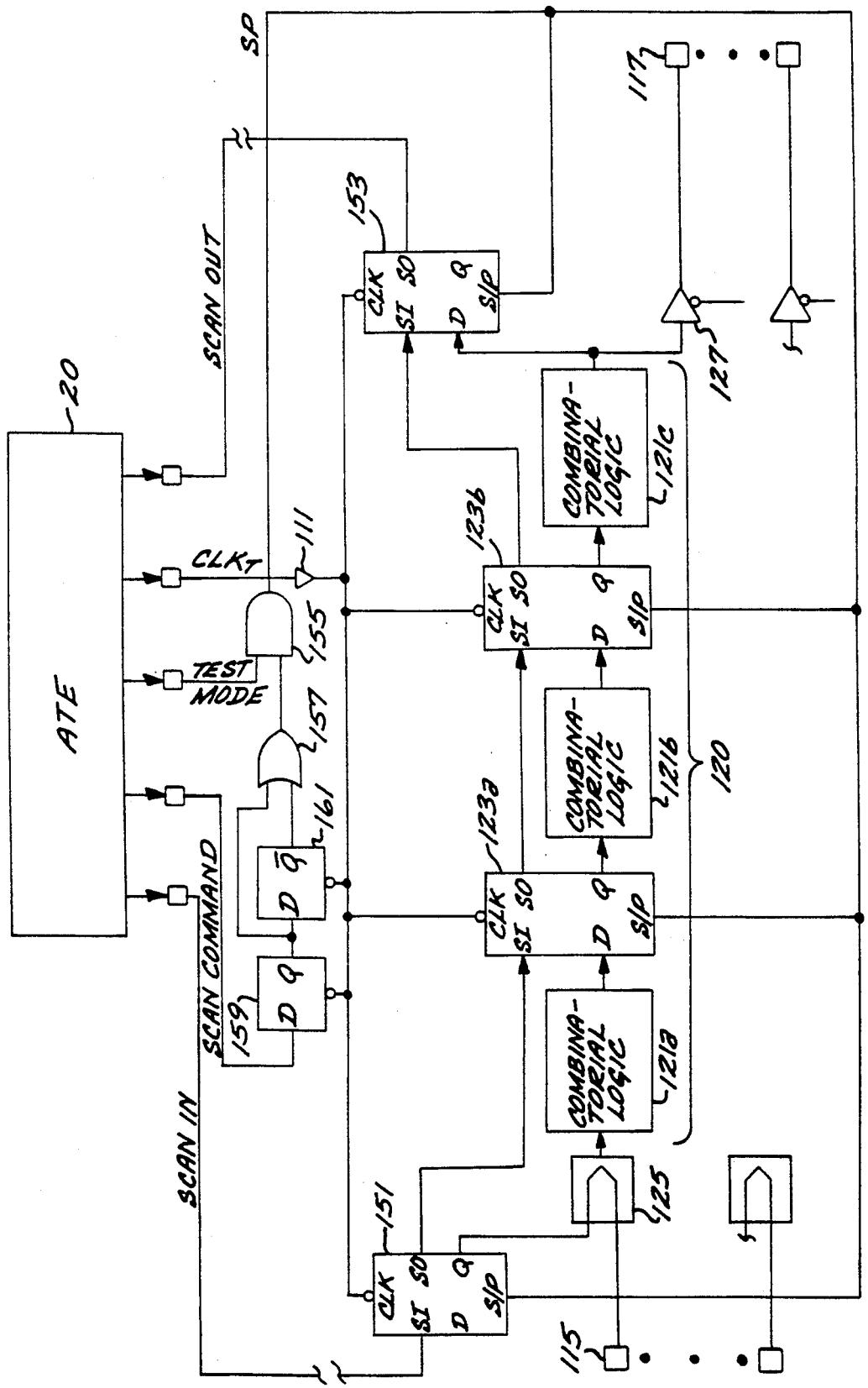
FIG. 3 is a schematic diagram of an AC test circuit in accordance with the invention for an integrated circuit having scan registers.

Referring now to FIG. 3, set forth therein is an implementation of the invention as to a representative data propagation path 120 for an integrated circuit having serial scan access wherein registers, such as registers 211, 215, 123a, 123b, contained in the integrated circuit are configured to be controlled to operate in parallel as conventional flip-flops or serially in one or more scan register chains. The data propagation path 120 includes combinatorial logic networks 121a, 121b, 121c and intervening scan registers 123a, 123b. The input to the data propagation path 120 is provided by the Q output of an input scan register 151 via a multiplexer 125 whose other input is connected to an I/O pad 115. In normal operation, the I/O pad 115 is connected to the data propagation path 120 via the multiplexer 125.

The serial input for the input scan register 151 is provided by the ATE 20 to an I/O pad 101, and the SI input of the input scan register is either directly connected to the I/O pad 101 or to the SO output of a prior in sequence scan register. The output of the multiplexer 125 is provided to the combinatorial logic network 121a whose output is provided to the D input of the scan register 123a. The input to the serial input SI of the scan register 123a is provided by the serial output SO of the input scan register 151. The Q output of the scan register 123b is provided to the combinatorial logic network 121b whose output is provided to the D input of the scan register 123b. The serial input SI of the scan register 123b is provided by the serial output SO of the scan register 123a. The Q output of the scan register 123b is provided to the combinatorial logic network 121c whose output is provided to the D input of an output scan register 153. The serial input SI of the output register 153 is provided by the serial output SO of the scan register 123b. The serial output SO of the output scan register 153 is provided to the ATE 20, either directly to an I/O pad 105 if the output register 153 is the last register in its scan chain, or via succeeding registers in its scan chain. The output of the combinatorial logic network 121c is further provided to a three-state output driver 127 whose output is intended to be connected to an I/O pad 117. For speed test purposes in accordance with the invention, the three-state output driver 127 can be disabled so as to greatly reduce noise in the test fixture.

The scan registers are clocked by the clock buffer 111 of the integrated circuit whose input for test purposes is a test clock signal $CLK_T$ that is provided by the ATE 20 on an I/O pad 125. The serial/parallel operation of the scan registers is controlled by a control signal SP provided to the parallel/serial inputs S/P of the registers. The serial/parallel control signal SP is generated by an AND gate 155 whose inputs are provided by (i) a TEST MODE signal provided by the ATE 20 on an I/O pad 119 of the integrated circuit and (ii) the output of an OR gate 157. One input to the OR gate 157 is provided by the Q output of a flip-flop 159 which receives a SCAN COMMAND signal provided by the ATE 20 on an I/O pad 103 of the integrated circuit, while the other input is provided by the negated output $\overline{Q}$ of a flip-flop 161 whose input is provided by the Q output of the flip-flop 159.

Figure 4:
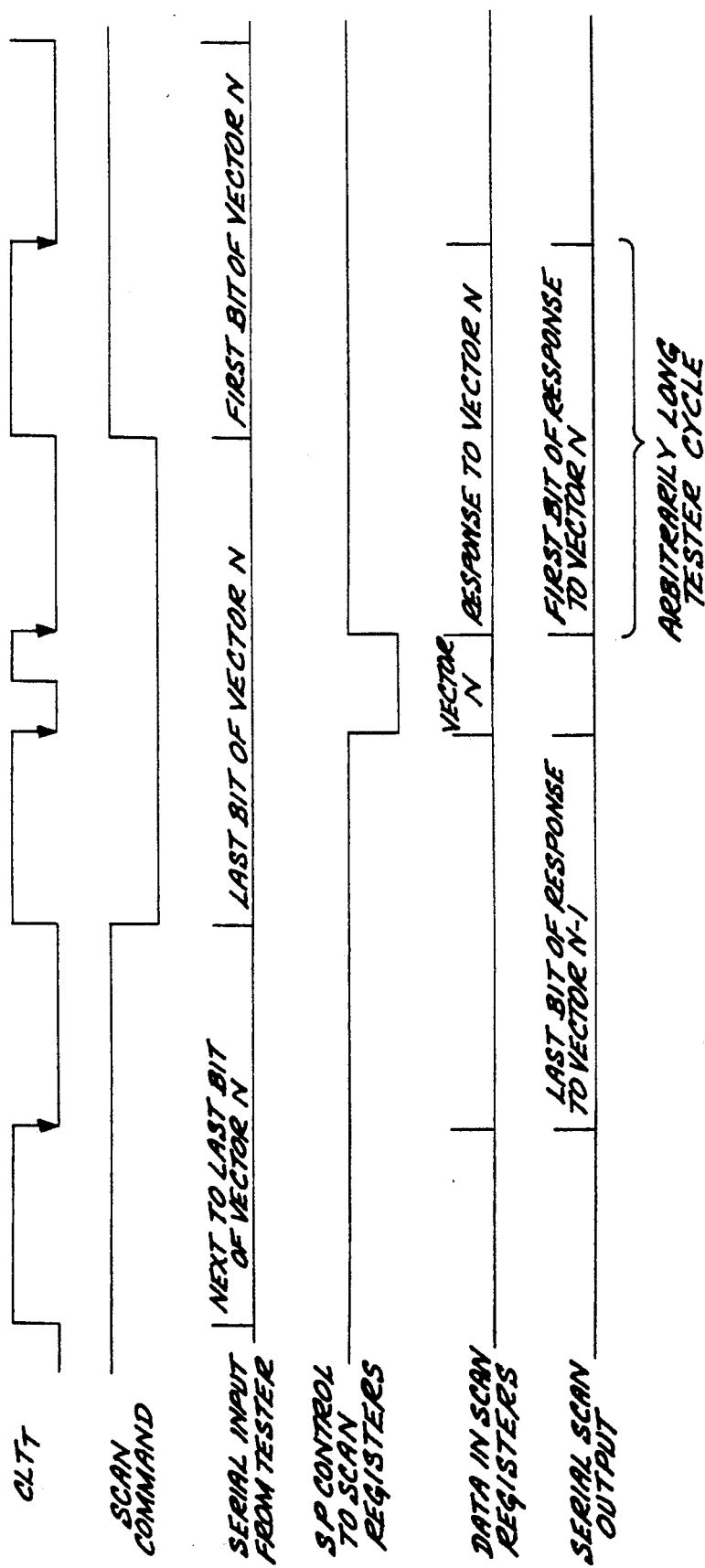
FIG. 4 is a timing diagram illustrating the timing and data propagation of the AC test circuit of FIG. 3.

Referring now to FIG. 4, the speed testing of the data propagation path 120 and other data propagation paths in the integrated circuit takes place as follows. The bits of an N-bit test vector T are serially loaded at a slow clock rate into the registers of the scan chain containing the scan registers 151, 123a, 123b, and 153, where the slow clock rate is selected pursuant to the requirements of the ATE 20 and/or associated fixturing. The vector bit boundaries are defined by the positive transitions of the test clock $CLK_T$, and the active transitions for the registers are the negative transitions of the test clock. The SCAN COMMAND signal is held high for the first $N-1$ bits of the test vector T, and is low for the Nth bit of the test vector. The test clock $CLK_T$ provides one cycle of the fast clock at the negative clock transition following the negative transition of the SCAN COMMAND signal. Pursuant to the negative clock transition at the start of the fast clock cycle, all bits of the test vector T will have been latched into the scan registers. Further, since the SCAN COMMAND is low during the one cycle of the fast clock, the SP control signal goes low pursuant to the negative transition at the start of the fast clock and then returns to high at the negative transition at the end of the fast clock period. Pursuant to the SP control signal being low, the scan registers operate in parallel so as to latch the data at their D inputs at the negative test clock transition at the end of the fast clock period. In this manner, the delays provided by combinatorial logic networks are tested by the transition of the contents of the receiving registers. For example, the delay of the combinatorial logic network 121a is tested by whether the contents of the register 123a changed (a) from the test vector value serially loaded therein (b) to the value that would be expected from the combinatorial logic network 121a (which would be based on the Q output of the input scan register 151) if the delay of the combinatorial network 121a allowed for sufficient set up time for the register 123a. Stated another way, the Q outputs of each register change on the negative transitions of the clock at the beginning and the end of the fast clock period. If the logic delay into a given register allows for sufficient set up time, then the contents of that register will have changed to a known expected value. For complete testing, multiple test vectors are scanned in and out.

It should be appreciated that depending upon implementation, the scan registers for any given data propagation path do not have to be adjacent registers in a given scan chain. The operation is still the same since the serially scanned inputs and outputs are correlated to the different scan registers.

In the circuit of FIG. 3, the three-state output buffer is not included in the speed testing so as to allow outputs of the integrated circuit to be disabled, but the buffer can be tested with the inclusion of conventional boundary scan components (not shown). Alternatively, the three-state output buffer could be included in the delay testing by connecting the output of the three-state buffer to the D input of the output scan register 153, whereby delay tested would be the cumulative delay of the combinatorial logic network 121c and the delay of the output buffer. Considered another way, the three-state buffer could be included in the combinatorial logic network 121c. In the event the three-state output buffer is included in the delay path being observed, it remains enabled during test, whereby the effect of capacitive loads on output buffers can be included in the measurement of output delay.

It is noted that implementation of the invention in accordance with FIG. 3 provides the capability for measuring the delay of any combinatorial logic network in the integrated circuit. This is achieved by defining the short clock period to be equal to the delay of the network to be tested. The test pattern set, or subset that is sufficient to exercise the network to be tested, is run, with the ATE 20 configured to mask out response bits from all combinatorial logic networks whose delays are longer than the path tested. This procedure is repeated for as many paths as desired, and allows for an exceptionally high degree of test thoroughness by allowing explicit measurement of every combinatorial logic network in the device.

The salient features of the foregoing implementation of the invention can be summarized a follows. Serial scan data transfer is performed with an arbitrarily slow clock rate as required by the ATE 20 and/or fixturing, and parallel transfer of a scanned in test vector for speed testing is performed during a single fast clock cycle which corresponds to the speed specification of the integrated circuit device or to a desired test speed. The parallel mode control for the registers is generated in the integrated circuit pursuant to an earlier provided command from the ATE 20, and therefore all data and control transfers to and from the ATE 20 can be at the slow clock rate.

While the implementation of FIG. 3 includes scan registers for the inputs and outputs of the integrated circuit containing scan registers, it should be appreciated that input and output latches as in the implementation of FIG. 1 could provided, for example for those integrated circuits that do not have scan registers for the inputs and outputs. Test data for the scan registers would be serially scanned into the scan registers pursuant to a slow clock as in FIG. 4, and test data for the input latches would be provided pursuant to the last cycle of the slow clock by which the last test data bit for the scan registers was clocked into the scan register chain. A fast clock cycle as in FIG. 4, while the scan registers are operating in the parallel mode, would then test the delays through the combinatorial networks as described above with respect to the circuit of FIG. 3, except that the outputs of combinatorial networks whose outputs are connected to I/O pads are latched by the output latches. After the one cycle of the fast clock, the test results in the scan registers are serially scanned out pursuant to a slow clock as in FIG. 4, and the test results held by the output latches can be sampled during the first half of the first cycle of the slow clock cycles by which the test results in the scan registers are serially scanned out.

The foregoing has been a disclosure of built-in test circuitry for integrated circuits that advantageously requires only one high bandwidth connection between the ATE and the integrated circuit device being tested for a clock signal. All other communications is performed at low bandwidth. As a result, ATEs for use with integrated circuits having the built-in test circuitry of the invention can be relatively inexpensive, fixturing can be straightforward, and testing can be performed at wafer probe. Further, all AC timing measurements (data strobing and latching) are performed on the integrated circuit device, resulting in higher accuracy. For implementations which utilize a single fast clock cycle for a given test, the inputs and outputs of the integrated do not change state while data is being applied and sampled in the integrated circuit, which minimizes external noise during the sensitive measurement period.

Although the foregoing has been a description and illustration of specific embodiments of the invention, various modifications and changes thereto can be made by persons skilled in the art without departing from the scope and spirit of the invention as defined by the following claims.

What is claimed is:

1. A test circuit for speed testing a plurality of data propagation paths of an integrated circuit device having a clock buffer and wherein each of the data propagation paths includes (i) a combinatorial logic network or (ii) N combinatorial logic networks and N−1 registers interposed between individual ones of the N combinatorial logic networks, the test circuit for comprising:
   a plurality of input storage means for the plurality of data propagation paths for receiving test data from the automatic test equipment and for providing respective input data for the associated data propagation paths; and
   a plurality of output storage means for respectively storing the outputs of the respective data propagation paths;
   wherein said input and output storage means and any internal registers in the data propagation paths are clocked with alternating single cycles of a first clock that can be arbitrarily slow and a second clock that corresponds to a desired test speed, whereby said first clock is utilized for (a) data transfer between the automatic test equipment and said input storage means and (b) data transfer between said output storage means and said automatic test equipment, and whereby any internal registers in the data propagation path and said output storage means are subjected to active clock transitions at the start and end of each cycle of said second clock such that test data is applied to, and sampled from, the combinatorial logic networks at the rate of the second clock so as to test whether the delays through the combinatorial logic networks are less than or equal to the period of said second clock.

2. The test circuit of claim 1 wherein the test data from the automatic test equipment includes a test vector that is provided two times with the contents of the test vector being shifted by one period of the first clock, so that all test vector transitions are tested in the combinatorial logic networks.

3. The test circuit of claim 1 wherein said input means comprises an input latch and wherein said output means comprises an output latch.

4. A test circuit for speed testing data propagation paths of an integrated circuit device having a clock buffer and wherein each data propagation path includes (i) a combinatorial logic network or (ii) N combinatorial logic networks and N−1 scan registers interposed between individual ones of the N combinatorial logic networks, the test circuit for comprising:

a plurality of input scan registers for the plurality of data propagation paths for providing input data for the respective data propagation paths; and a plurality of output scan registers for storing the outputs of the respective data propagation paths;

wherein said input and output scan registers and any internal scan registers in the data propagation paths are (a) serially operated pursuant to a first clock that can have an arbitrarily long period to serially scan in test values, (b) subsequently operated in parallel pursuant to active clock transitions at the start and end of a cycle of a second clock having a period that corresponds to a desired test speed, and (c) serially operated pursuant to the first clock to serially scan out test result values, whereby test values are applied to, and sampled from, the combinatorial logic networks at the rate of the second clock so as to test whether the delays through the combinatorial logic networks are less than or equal to the second clock period.

5. The test circuit of claim 4 wherein the period of said second clock is adjusted depending upon which combinatorial logic networks are being tested, and wherein the test result values are evaluated only for those combinatorial logic networks being tested, such that a selected combinatorial logic network can be tested for its particular specified propagation delay.

6. In an integrated circuit having (a) a clock buffer, (b) a plurality of data propagation paths respectively (i) a combinatorial logic network or (ii) N combinatorial logic networks and N−1 registers interposed between individual ones of the N combinatorial logic networks, (c) a plurality of input latches for the plurality of data propagation paths for receiving test data from the automatic test equipment and for providing respective input data for the associated data propagation paths, and (d) a plurality of output latches for respectively storing the outputs of the respective data propagation paths, a method for speed testing the data propagation paths comprising the steps of:

(A) clocking the input and output latches and any internal registers in the data propagation paths alternating single cycles of a first clock that can be arbitrarily slow and a second clock that corresponds to a desired test speed;

(B) transferring data between the automatic test equipment and the input latches pursuant to the first clock;

(C) transferring data between the input latch and the data propagation path pursuant to the second clock, and transferring data between the output of the data propagation paths and the associated output latches pursuant to second clock;

(D) transferring data between the output latches and the automatic test equipment pursuant to the first clock;

whereby any internal registers in the data propagation path and said output storage means are subjected to active clock transitions at the start and end of each cycle of said second clock such that test data is applied to, and sampled from, the combinatorial logic networks at the rate of the second clock, so as to test whether the delays through the combinatorial logic networks are less than or equal to the period of said second clock.

7. In an integrated circuit device having (a) a clock buffer, (b) a plurality of data propagation paths respectively including (i) a combinatorial logic network or (ii) N combinatorial logic networks and N−1 scan registers interposed between individual ones of the N combinatorial logic networks, (c) a plurality of input scan registers for the plurality of data propagation paths for providing input data for the respective data propagation paths, and (d) a plurality of output scan registers for storing the outputs of the respective data propagation paths, a method for speed testing the data propagation paths comprising the steps of:

(A) serially operating the input and output scan registers and any internal scan registers in the data propagation paths pursuant to a first clock that can have an arbitrarily long period to serially scan in test values;

(B) subsequently operating the input and output scan registers and any internal scan registers in the data propagation paths parallel pursuant to active clock transitions at the start and end of a cycle of a second clock having a period that corresponds to a desired test speed; and (C) serially operating the input and output scan registers and any internal scan registers in the data propagation paths pursuant to the first clock to serially scan out test result values;

whereby test values are applied to, and sampled from, the combinatorial logic networks at the rate of the second clock, which tests whether the delays through the combinatorial logic networks are less than or equal to the second clock period.

8. In an integrated circuit device having (a) a clock buffer, (b) a plurality of data propagation paths respectively including (i) a combinatorial logic network or (ii) N combinatorial logic networks and N−1 scan registers interposed between individual ones of the N combinatorial logic networks,, (c) a plurality of input latches for the plurality of data propagation paths for providing input data for the respective data propagation paths, and (d) a plurality of output latches for storing the outputs of the respective data propagation paths, a method for speed testing the data propagation paths comprising the steps of:

(A) operating the internal scan registers in the data propagation paths in the serial mode pursuant a series of cycles of a first clock that can have an arbitrarily long period to serially scan in scan register test values;

(B) operating the input latches pursuant to receive latch test values pursuant to the cycle of the first clock when the last register test value is scanned into internal scan registers;

(C) operating the input and output latches and any the internal scan registers in the data propagation paths in parallel pursuant to active clock transitions at the start and end of a cycle of a second clock having a period that corresponds to a desired test speed;

(D) operating the internal scan registers in the data propagation paths in the serial mode pursuant to the first clock to serially scan out test result values; and (E) operating the output latches pursuant to the first clock so that the test result values in the output latches can be read during the first cycle of the first clock utilized in step (D) to serially scan out test result values from the internal scan registers;

whereby test values are applied to, and sampled from, the combinatorial logic networks at the rate of the second clock, so as to test whether the delays through the combinatorial logic networks are less than or equal to the second clock period.

* * * * *